US009159547B2

(12) United States Patent
Rogers et al.

(10) Patent No.: US 9,159,547 B2
(45) Date of Patent: Oct. 13, 2015

(54) TWO STEP METHOD OF RAPID CURING A SEMICONDUCTOR POLYMER LAYER

(71) Applicant: DECA TECHNOLOGIES INC., Tempe, AZ (US)

(72) Inventors: William Boyd Rogers, Raleigh, NC (US); Willibrordus Gerardus Maria van den Hoek, Saratoga, CA (US)

(73) Assignee: DECA Technologies Inc., Tempe, AZ (US)

( * ) Notice: Subject to any disclaimer, the term of this patent is extended or adjusted under 35 U.S.C. 154(b) by 0 days.

(21) Appl. No.: 14/029,557

(22) Filed: Sep. 17, 2013

(65) Prior Publication Data
US 2015/0079805 A1    Mar. 19, 2015

(51) Int. Cl.
*H01L 21/31* (2006.01)
*H01L 21/02* (2006.01)
*H01L 21/768* (2006.01)

(52) U.S. Cl.
CPC .... *H01L 21/02118* (2013.01); *H01L 21/76802* (2013.01)

(58) Field of Classification Search
CPC ............. H01L 21/02348; H01L 21/02345; H01L 21/02351; H01L 21/02422; H01L 21/0231; H01L 21/469; H01L 21/76822; H01L 21/76804; H01L 21/768; H01L 21/76802; H01L 21/76805
USPC ................... 438/612, 613, 780, 781
See application file for complete search history.

(56) References Cited

U.S. PATENT DOCUMENTS

| | | | |
|---|---|---|---|
| 5,013,689 A * | 5/1991 | Yamamoto et al. | 438/702 |
| 6,162,652 A * | 12/2000 | Dass et al. | 438/18 |
| 6,803,327 B1 * | 10/2004 | Cheu et al. | 438/781 |
| 7,335,608 B2 * | 2/2008 | Tanikella | 438/780 |
| 2002/0050629 A1 * | 5/2002 | Seshan et al. | 257/632 |
| 2005/0208779 A1 | 9/2005 | Klauk et al. | |
| 2006/0263727 A1 * | 11/2006 | Lee et al. | 430/311 |
| 2007/0014018 A1 * | 1/2007 | Wheatley et al. | 359/580 |
| 2007/0166992 A1 * | 7/2007 | Daubenspeck et al. | 438/613 |
| 2008/0054457 A1 * | 3/2008 | Lin et al. | 257/737 |
| 2009/0032812 A1 * | 2/2009 | Herman et al. | 257/43 |
| 2012/0025383 A1 * | 2/2012 | Daubenspeck et al. | 257/762 |
| 2013/0032949 A1 | 2/2013 | Lin et al. | |
| 2013/0075739 A1 | 3/2013 | Loy et al. | |

FOREIGN PATENT DOCUMENTS

| | | | | |
|---|---|---|---|---|
| JP | 2006-189788 | * | 7/2006 | G03F 7/038 |
| JP | 2006189788 | | 7/2006 | |

* cited by examiner

*Primary Examiner* — Khiem D Nguyen
(74) *Attorney, Agent, or Firm* — Booth Udall Fuller, PLC (57) ABSTRACT

A semiconductor device and method of making the semiconductor device is described. A semiconductor die is provided. A polymer layer is formed over the semiconductor die. A via is formed in the polymer layer. The polymer layer is crosslinked in a first process. The polymer layer is thermally cured in a second process. The polymer layer can comprise polybenzoxazoles (PBO), polyimide, benzocyclobutene (BCB), or siloxane-based polymers. A surface of the polymer layer can be crosslinked by a UV bake to control a slope of the via during subsequent curing. The second process can further comprise thermally curing the polymer layer using conduction, convection, infrared, or microwave heating. The polymer layer can be thermally cured by increasing a temperature of the polymer at a rate greater than or equal to 10 degrees Celsius per minute, and can be completely cured in less than or equal to 60 minutes.

9 Claims, 6 Drawing Sheets

TWO STEP METHOD OF RAPID CURING A SEMICONDUCTOR POLYMER LAYER

TECHNICAL FIELD

The disclosure relates in general to semiconductor devices and, more particularly, to the curing of protective polymer layers on semiconductor devices by using a rapid thermal cure after crosslinking a surface of the polymer layer, for example, by subjecting the polymer layer to an ultraviolet (UV) bake.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing. Front-end manufacturing involves the formation of a plurality of semiconductor die on the surface of a semiconductor wafer. Each semiconductor die is typically identical and contains circuits formed by electrically connecting active and passive components. Back-end manufacturing, especially wafer-level or panel level packaging, typically involves providing an environmentally robust encapsulation or protection of the device, formation of broader pitch interconnect structures, testing and singulation of individual semiconductor die from the finished wafer or panel. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Back-end processing can often include use of one or more insulating or polymer layers, such as PBO. PBO is a polymer used in the electronics packaging industry as an inter-level dielectric in packaging applications such as wafer level chip scale packaging (WLCSP) applications. PBO, like other insulating and polymer layers, can be photosensitive or non-photosensitive.

Insulating and polymer layers that are photosensitive can be patterned using photolithography. Photolithography involves the deposition of light sensitive material, e.g., a layer of photosensitive PBO. A pattern is typically transferred from a form of photomask to the photosensitive material using light. In an embodiment, the portion of the photosensitive material subjected to light is removed using a developer chemistry, exposing portions of the underlying layer. In another embodiment, the portion of the photosensitive material not subjected to light is removed using a developer chemistry, exposing portions of the underlying layer. The portions of the photosensitive film remaining can become a permanent part of the device structure.

Insulating and polymer layers that are not photosensitive can be patterned using photolithography and subtractive etching. Photolithography in this case involves the deposition of light sensitive material, e.g., photoresist, over the layer to be patterned, e.g., a layer of PBO. A pattern is typically transferred from a form of photomask to the photoresist using light. In one embodiment, the portion of the photoresist pattern subjected to light is removed using a solvent, exposing portions of the underlying layer to be patterned. In another embodiment, the portion of the photoresist pattern not subjected to light is removed using a solvent, exposing portions of the underlying layer to be patterned. The remaining photoresist serves as a mask protecting portions of the underlying layer. The exposed portions of the underlying layer are then removed by a subtractive etch process, typically wet etching, plasma etching, or laser ablation. The process used for the subtractive etch must have good selectivity to the photoresist layer, i.e., it must etch the underlying PBO or polymer layer while leaving the photoresist mask intact. Following the subtractive etch, the remainder of the photoresist is removed, leaving behind a patterned layer which becomes a permanent part of the device structure.

After photo processing the insulating, polymer, or PBO layer (i.e. by coating, exposing, and developing the photosensitive PBO or by covering the non-photosensitive PBO with a photoresist and performing subtractive etching) the polymer is cured at high temperatures to optimize the final film properties, reliability, and performance of the device.

Figure 1A:
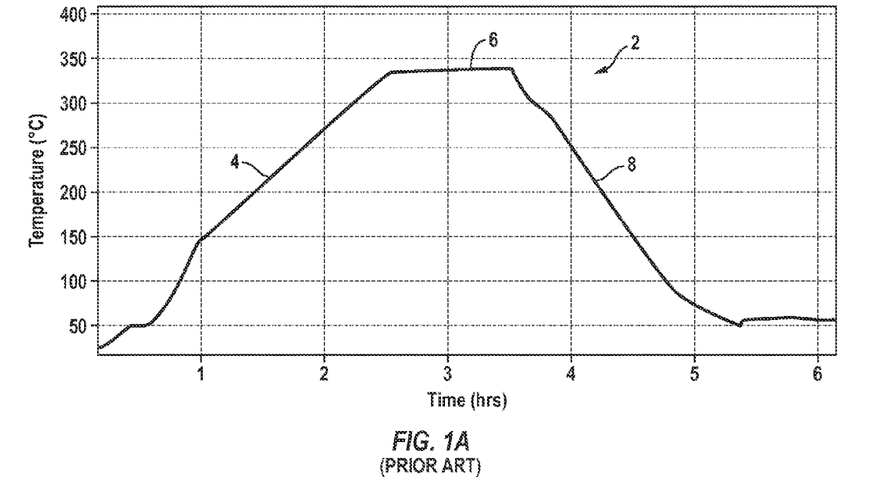
FIGS. 1A and 1B illustrate temperature profiles for curing standard PBO and low temperature PBO as practiced in the prior art.

As practiced in the prior art, and as per vendor recommendations, PBO or polymer curing is generally performed in a box oven or in a vertical furnace in a controlled nitrogen ($N_2$)

environment that requires slowly increasing a temperature of the box oven or vertical furnace for the curing of the PBO or polymer. Two types of PBOs, polymers, or insulating layers are commonly available in the market today: (1) a high cure temperature version, here referred to as standard PBO, standard polymer, or standard insulating layer; and a low cure temperature version, referred to as low temperature PBO, low temperature polymer, or low temperature insulating layer. FIG. 1A illustrates a typical temperature profile 2 for curing standard PBO in a box oven or vertical furnace as known in the art. A first or ramp-up portion 4 of temperature profile 2 is the period in which temperature is increased from room temperature (about 20-25° C.) to a maximum curing temperature. During ramp-up portion 4, temperature is slowly increased at a rate of approximately 2.1° C. per minute. A top or peak portion 6 of temperature profile 2, in FIG. 1A shows a desirable curing temperature of about 340° C. is achieved and maintained for a period of approximately one hour or 60 minutes. Typical peak temperatures for curing standard PBO in box ovens range from approximately 320° C. to 340° C. A final or ramp-down portion 8 of temperature profile 2 shows that the temperature is slowly decreased at a rate of approximately 3.2° C. per minute until the PBO layer and box oven or vertical furnace has cooled from the curing temperature to room temperature.

Figure 1B:
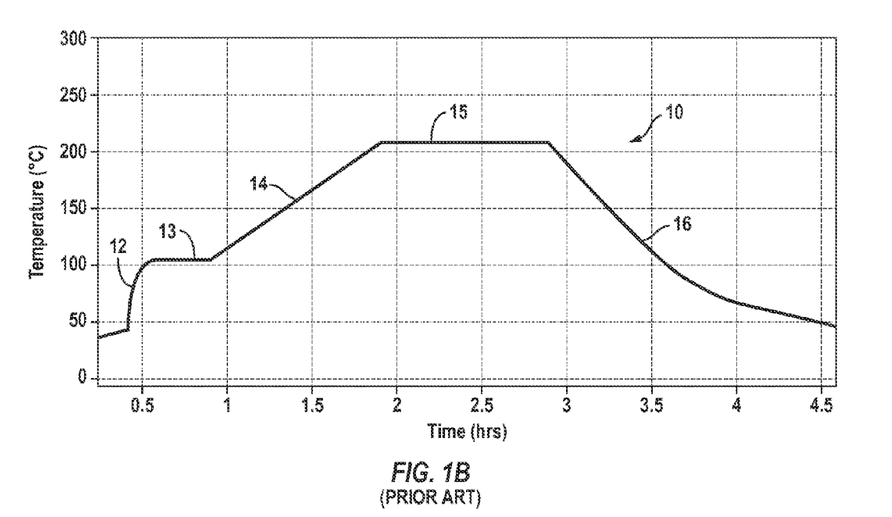

FIG. 1B illustrates a typical temperature profile 10 for curing low temperature PBO in a box oven or vertical furnace as known in the art. A first or ramp-up portion 12 of temperature profile 10 is the period in which temperature is increased rapidly from room temperature (about 20-25° C.) to 100° C. The temperature is held at approximately 100° C. for a period of approximately 30 minutes, as indicated by second or constant portion 13 of temperature profile 10. Another ramp-up or third portion 14 of temperature profile 10 is the period in which temperature is increased from approximately 100° C. to a maximum curing temperature as indicated by top or peak portion 15. During ramp-up portion 14, temperature is slowly increased at a rate of approximately 1.67° C. per minute. Top or peak portion 15 of temperature profile 10, in FIG. 1B shows a desirable curing temperature of about 200° C. is achieved and maintained for a period of approximately one hour or 60 minutes. Typical peak temperatures for curing low cure PBO in box ovens range from 175° C. to 200° C. A final or ramp-down portion 16 of temperature profile 10 shows that the temperature is slowly decreased at a rate of approximately 2.2° C. per minute until the PBO layer and box oven or vertical furnace has cooled from the curing temperature to room temperature.

By slowing a rate at which temperature increases, particularly, for example, during ramp-up portion 4 of temperature profile 2 or during ramp up portion 14 of temperature profile 10, a contour or slope of the vias formed within the PBO layer is maintained and does not undesirably deform during heating or curing. As shown in FIGS. 1A and 1B, an entire cure cycle as practiced in the prior art generally requires multiple hours to complete, 4 to 5 hours being typical. See, e.g., HD8820 Process Guide, published by HD Microsystems (August 2005) relating to standard PBO treatment, and HD8930 Process Guide, published by HD Microsystems (May 2009) relating to low temperature PBO treatment. Curing of PBO using the conventional techniques described above with respect to FIGS. 1A and 1B is performed by major Outsourced Semiconductor Assembly and Test (OSAT) providers and WLCSP providers in the fabrication of WLCSPs such as, for example, Amkor, Advanced Semiconductor Engineering (ASE), Taiwan Semiconductor Manufacturing Company (TSMC), Siliconware Precision Industries Co. Ltd. (SPIL), and Stats-Chippac.

SUMMARY

The foregoing and other aspects, features, and advantages will be apparent to those artisans of ordinary skill in the art from the DESCRIPTION and DRAWINGS, and from the CLAIMS. Accordingly, in an aspect, a method of making a semiconductor device can comprise providing semiconductor die, forming a polymer layer over the semiconductor die, forming a via in the polymer layer, crosslinking a surface of the polymer layer in a first process, and thermally curing the polymer layer in a second process.

The method of making the semiconductor device can further comprise forming the polymer layer as a layer of polybenzoxazoles (PBO), polyimide, benzocyclobutene (BCB), siloxane-based polymer, or epoxy-based polymers. The polymer layer can be exposed to ultraviolet (UV) radiation to crosslink the surface of the polymer layer in the first process to subsequently control a slope of the via during the second process. The polymer layer can be cured in the second process by using at least one thermal process selected from the group consisting of conduction, convection, infrared, and microwave heating. The polymer layer can be cured by increasing a temperature of the polymer layer at a rate greater than or equal to 10 degrees Celsius per minute. The polymer layer can be completely thermally cured, comprising a temperature ramp up, a peak temperature dwell, a temperature ramp down, and a complete thermal anneal, in a time of less than or equal to 60 minutes. The polymer layer can be formed as a permanent portion of the semiconductor device. The polymer layer can be thermally cured by heating the polymer layer at a temperature greater than or equal to 200 degrees Celsius for a time of less than 30 minutes. The polymer layer can be exposed to UV radiation at an elevated temperature in a range of 100-200 degrees Celsius. The polymer layer can be thermally cured in a low $O_2$ environment in which $O_2$ comprises less than or equal to 100 parts per million of the low $O_2$ environment. A witness mark can be formed as a discontinuity in a slope of the via along a portion of the via.

In another aspect, a method of making a semiconductor device can comprise forming a polymer layer, forming a via in the polymer layer, crosslinking the polymer layer, and curing the polymer layer.

The method of making the semiconductor device can further comprise forming the polymer layer as a layer of PBO, polyimide, BCB, siloxane-based polymer, epoxy-based polymer, or other polymer formed as a permanent portion of the semiconductor device. The polymer layer can be exposed to UV radiation to crosslink a surface of the polymer layer and to subsequently control a slope of the via during the curing. The polymer layer can be thermally cured by using at least one thermal process selected from the group consisting of conduction, convection, infrared, and microwave heating. The polymer layer can be thermally cured by increasing a temperature of the polymer layer at a rate greater than or equal to 10 degrees Celsius per minute. The polymer layer can be completely thermally cured, comprising a temperature ramp up, a peak temperature dwell, a temperature ramp down, and a complete thermal anneal, in a time less than or equal to 60 minutes. The polymer layer can be cured to a tensile strength of greater than or equal to 110 megapascals, an elongation to failure of greater than or equal to 45 percent, and a modulus of elasticity of less than or equal to 2.4 gigapascals. The via can be formed with an average wall angle greater than or equal to 50 degrees. The polymer layer can be exposed to UV radiation at an elevated temperature in a range of 100-200 degrees Celsius. A witness mark can be formed along a portion of the via.

In another aspect, a method of making a semiconductor device can comprise forming a via in an insulating layer, stabilizing the insulating layer, and curing the insulating layer after stabilizing the insulating layer.

The method of making the semiconductor device can further comprise forming the insulating layer as polymer layer comprising PBO, polyimide, BCB, siloxane-based polymer, or epoxy-based polymer. A surface of the insulating layer can be stabilized to control a slope of the via during curing. The insulating layer can be thermally cured using at least one thermal process selected from the group consisting of conduction, convection, infrared, and microwave heating. The insulating layer can be thermally cured by increasing a temperature of the insulating layer at a rate greater than or equal to 10 degrees Celsius per minute. The insulating layer can be completely thermally cured in a time less than or equal to 60 minutes. The insulating layer can be UV baked at a temperature different than a temperature at which the insulating layer is cured. The insulating layer can be cured in an environment of less than or equal to 100 parts per million $O_2$. A witness mark can be formed around the via.

DETAILED DESCRIPTION

The present disclosure includes one or more embodiments in the following description with reference to the figures, in which like numerals represent the same or similar elements. It will be appreciated by those skilled in the art that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGs. are illustrative representations and are not necessarily drawn to scale.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography. Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the layer to be patterned such as surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. Alternatively, some types of materials are patterned by directly depositing material into the areas or voids formed by the photoresist or by a previous deposition/etch process using techniques such as electroless and electrolytic plating. The chemistry of photoresists is such that the photoresist remains substantially intact and resists removal by chemical etching solutions or plating chemistries while the portion of the top layers of the semiconductor wafer not covered by the photoresist is removed or is added to by plating. The process of forming, exposing, and removing the photoresist, as well as the process of removing a portion of the semiconductor wafer or adding to a portion of the wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer.

Alternatively, photolithography can be accomplished without the use of a photoresist when the material to be patterned is itself photosensitive. In this case, the photosensitive material is coated on the device surface using spin coating, lamination, or other suitable deposition technique. A pattern is then transferred from a photomask to the photosensitive material using light in an operation typically called exposure. In an embodiment, the portion of the photosensitive material subjected to light is removed, or developed, using a solvent, exposing portions of the underlying layer. Alternatively, in another embodiment, the portion of the photosensitive material not subjected to light is removed, or developed, using a solvent, exposing portions of the underlying layer. The remaining portions of the photosensitive film can become a permanent part of the device structure.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. Alternatively, mechanical abrasion without the use of corrosive chemicals is used for planarization. In some embodiments, purely mechanical abrasion is achieved by using a belt grinding machine, a standard wafer backgrinder, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

The electrical system can be a stand-alone system that uses the semiconductor device to perform one or more electrical functions. Alternatively, the electrical system can be a subcomponent of a larger system. For example, the electrical system can be part of a cellular phone, personal digital assistant (PDA), digital video camera (DVC), or other electronic communication device. Alternatively, the electrical system can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
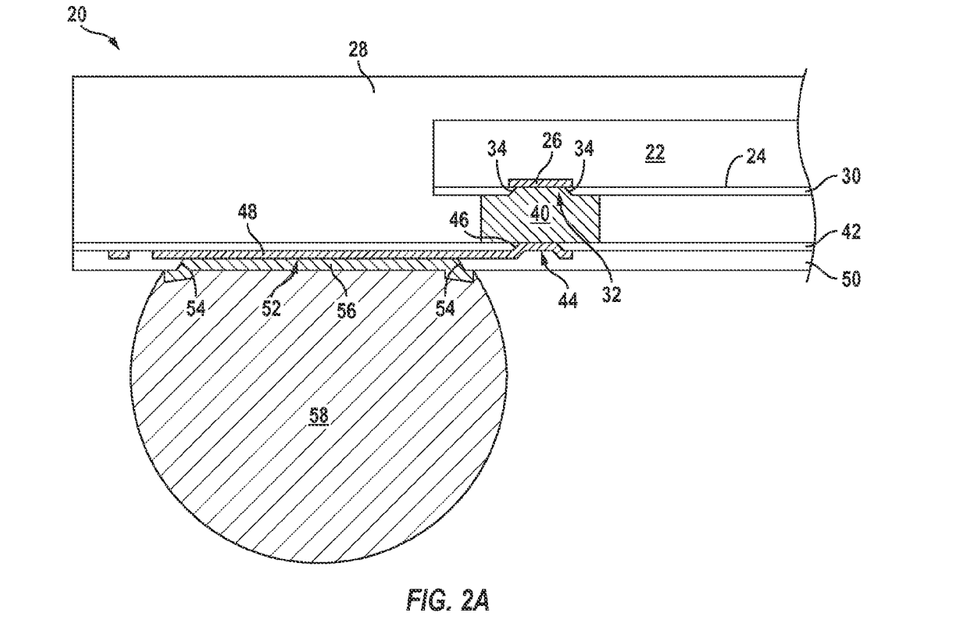
FIGS. 2A and 2B illustrate a semiconductor packages comprising a number of PBO layers further comprising vias.

FIG. 2A shows a cross-sectional view of a portion of semiconductor device or package 20 similar to the devices described above. Semiconductor device 20 can comprise a number of layers of PBO used as semiconductor die packaging for forming insulating layers within the semiconductor device. More specifically, semiconductor device 20 comprises a semiconductor die 22 comprising active surface 24 and contact pad 26 disposed within, and surrounded by, encapsulant 28. Semiconductor device 20 can comprise a first polymer or insulating layer 30, that also includes PBO, polyimide, benzocyclobutene (BCB), siloxane-based polymer, epoxy-based polymer, or other suitable material, which is disposed over active surface 24 and partially covers contact pad 26. First polymer layer 30 can be a standard PBO layer or a low temperature PBO layer. A via or opening 32 with a sloped sidewall 34 is formed completely through first polymer layer 30 to expose a portion of contact pad 26. A conductive interconnect structure 40, such as a copper pillar, is formed over contact pad 26, over polymer layer 30 and within via 32, and partially surrounded by encapsulant 28 to provide electrical interconnection between semiconductor die 22 and points external to semiconductor device 20.

A second polymer or insulating layer 42, that also includes PBO, polyimide, BCB, siloxane-based polymer, epoxy-based polymer, or other suitable material, is formed over encapsulant 28 and interconnect structure 40. In an embodiment, second polymer layer 42 can be a low cure PBO layer or a standard PBO layer. A via or opening 44 with a sloped sidewall 46 is formed completely through second polymer layer 42 to expose a portion of interconnect structure 40. A conductive layer 48 comprising one or more conductive layers is formed as part of a redistribution layer (RDL), such as a fan-out RDL, to route or direct electrical signals from semiconductor die 22 to points external to semiconductor device 20.

A third polymer or insulating layer 50, that also includes PBO, polyimide, BCB, siloxane-based polymer, epoxy-based polymer, or other suitable material, is formed over conductive layer 48 and second polymer layer 42. In an embodiment, third polymer layer 50 can be a low cure PBO layer instead of a standard PBO layer. A via or opening 52 with a sloped sidewall 54 is formed completely through the third polymer layer 50 to expose a portion of conductive layer 48. An under bump metallization (UBM) layer 56 comprising one or more conductive layers is formed within via 52 through third polymer layer 50 to assist in routing or directing electrical signals from semiconductor die 22 to points external to semiconductor device 20 and improve a mechanical and electrical connection between conductive layer 48 and a subsequently formed interconnect structure such as a conductive bump or solder bump 58.

Thus, FIG. 2A shows three vias, vias 32, 44, and 52, are formed in three polymer or insulating layers, that is polymer layers 30, 42, and 50, respectively. In an embodiment, polymer layer 30 is either a standard or low temperature polymer layer, while polymer layers 42 and 50 are low cure polymer layers, such as low cure PBO. Vias 32, 44, and 52 can be formed using laser drilling, mechanical drilling, deep reactive ion etching (DRIE), or other suitable process. In an embodiment, polymer layers 32, 44, and 52 are photoimagable layers that are formed and patterned (by coating, exposing, and developing as described above) to create vias 32, 44, and 52, which can extend completely through the polymer layers. After formation of vias 32, 44, and 52, polymer layers 30, 42, and 50 are cured.

Figure 2B:
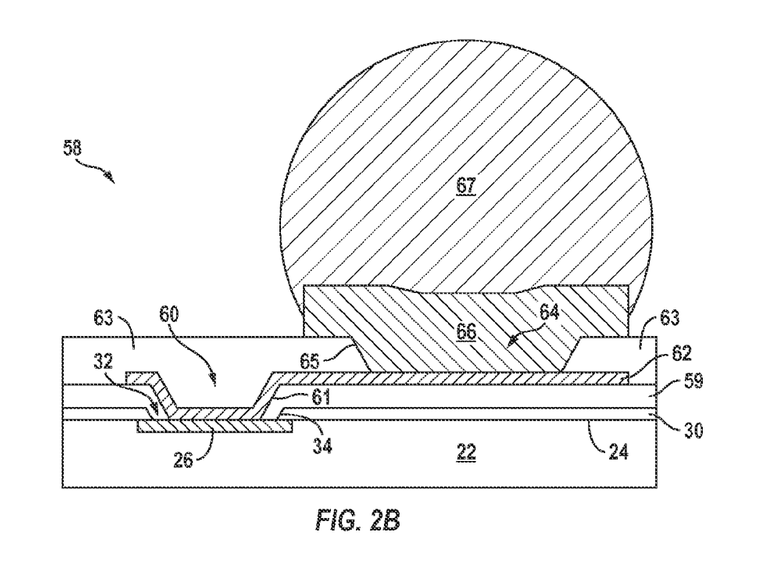

FIG. 2B shows a cross-sectional view of a portion of semiconductor device or package 58 similar to the devices described above, including semiconductor device 20 of FIG. 2A. Semiconductor device 58 can comprise a number of layers of PBO used as semiconductor die packaging for forming insulating layers within the semiconductor device. More specifically, semiconductor device 58 comprises a semiconductor die 22 comprising active surface 24 and contact pad 26, similar to semiconductor die 22 of semiconductor device 20 shown in FIG. 2A. Semiconductor die 22 can also be disposed within, and surrounded by, an encapsulant. Semiconductor device 58, similar to semiconductor device 20, can comprise a first polymer or insulating layer 30, that also includes PBO, polyimide, BCB, siloxane-based polymer, epoxy-based polymer, or other suitable material, which is disposed over active surface 24 and partially covers contact pad 26. First polymer layer 30 can be a standard PBO layer or a low temperature PBO layer. A via or opening 32 with a sloped sidewall 34 is formed completely through first polymer layer 30 to expose a portion of contact pad 26.

A second polymer or insulating layer 59, that also includes PBO, polyimide, BCB, siloxane-based polymer, epoxy-based polymer, or other suitable material, is formed over semiconductor die 22, contact pad 26, and first polymer layer 30. In an embodiment, second polymer layer 59 can be a low cure PBO layer or a standard PBO layer. A via or opening 60 with a sloped sidewall 46 is formed completely through second polymer layer 59 to expose a portion of contact pad 26. A conductive layer 62 comprising one or more conductive layers is formed as part of an RDL, such as a fan-out RDL, to route or direct electrical signals from semiconductor die 22 to points external to semiconductor device 58.

A third polymer or insulating layer 63, that also includes PBO, polyimide, BCB, siloxane-based polymer, epoxy-based polymer, or other suitable material, is formed over conductive layer 62 and second polymer layer 59. In an embodiment, third polymer layer 63 can be a low cure PBO layer or a standard PBO layer. A via or opening 64 with a sloped sidewall 65 is formed completely through the third polymer layer 63 to expose a portion of conductive layer 62. A UBM layer 66 comprising one or more conductive layers is formed within via 64 through third polymer layer 63 to assist in routing or directing electrical signals from semiconductor die 22 to points external to semiconductor device 58 and improve a mechanical and electrical connection between conductive layer 62 and a subsequently formed interconnect structure such as a conductive bump or solder bump 67.

Thus, FIG. 2B shows three vias, vias 32, 60, and 64, are formed in three polymer or insulating layers, that is polymer layers 30, 59, and 63, respectively. In an embodiment, polymer layer 30 is either a standard or low temperature polymer layer, while polymer layers 59 and 63 are low cure polymer layers, such as low cure PBO. Vias 32, 60, and 64 can be formed using laser drilling, mechanical drilling, DRIE, or other suitable process. In an embodiment, polymer layers 32, 60, and 64 are photoimagable layers that are formed and patterned (by coating, exposing, and developing as described above) to create vias 32, 60, and 64, which can extend completely through the polymer layers. After formation of vias 32, 60, and 64, polymer layers 30, 59, and 63 are cured.

A primary factor limiting the curing speed of polymer layers in semiconductor devices or packages, such as polymer layers 30, 42, and 50 of semiconductor device 20 in FIG. 2A and polymer layers 30, 59, and 63 of semiconductor device 58 in FIG. 2B is control of sloped sidewalls 34, 46, and 54, as well as sloped sidewalls 34, 61, and 65, respectively. A slope of via sidewalls that is initially steep after formation of the via tends to round significantly and become less steep if the polymer layer in which the via is formed is cured through a process in which temperature is increased too rapidly. Thus, as discussed above with respect to FIGS. 1A and 1B, as known in the prior art, curing of polymer layers, such as PBO layers, has typically been achieved by increasing a temperature of the polymer or PBO at a rate on the order of approximately 2° C. per minute. Accounting for rounded vias with less steeply formed sidewalls can require larger metal capture pads such as portions of contact pad 26, interconnect structure 40, conductive layers 48 and 63, as well as UBM layers 56 and 66 in order to provide good electrical interconnection through the vias while effectively covering the vias. Enlarging contact pads or capture pads increases an effective pitch of packaging, which requires a larger area for a same number of connections. Increasing the pitch of package interconnections is contrary to the objective of providing smaller, more compact packages and semiconductor devices. Accordingly, less steeply formed sidewalls have been avoided by requiring gradual increases in temperature for the curing polymer layers and PBO layers used within semiconductor packaging. A comparison of via slope with respect to curing the material in which the via is formed is made below with respect to FIGS. 3A-3C.

Figure 3A:
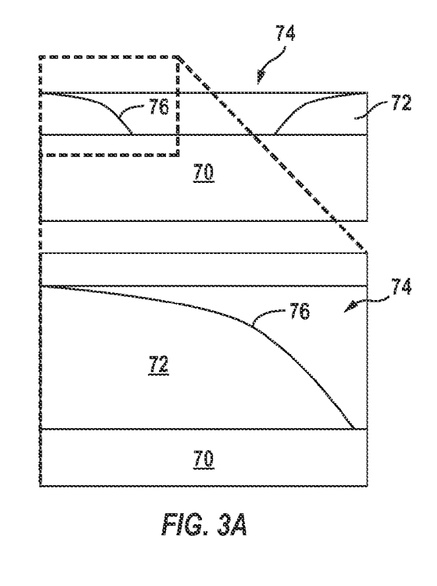
FIGS. 3A-3C illustrate different via sidewall slopes resulting from various methods of curing the PBO layers in which the vias are formed.
Figure 3B:
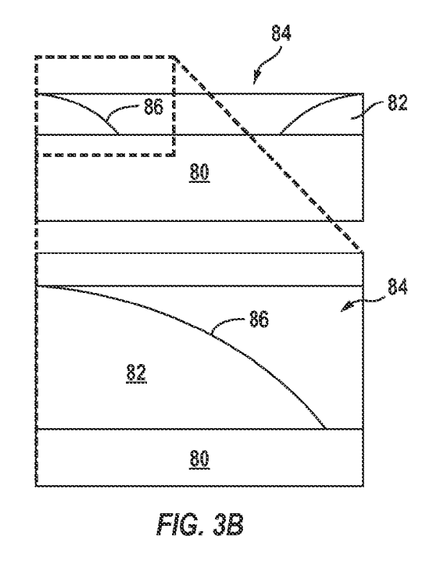
Figure 3C:
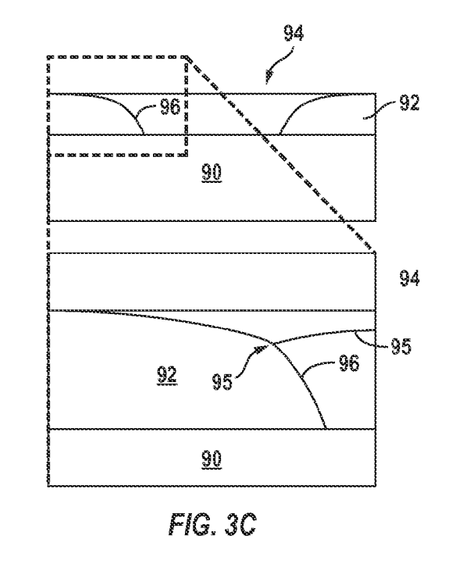

Each of FIGS. 3A-3C shows vias including sidewalls of different profiles, contours, or slopes formed in the polymer layers. The different slopes of the via sidewalls, as discussed in greater detail below, result from how the polymer layers are cured after the vias are formed in the polymer layers. FIG. 3A shows an enlarged cross sectional view of a representative profile, contour, or via slope for a via formed in a polymer or insulating layer, such as PBO, polyimide, BCB, siloxane-based polymer, epoxy-based polymer, or other suitable material that is cured using a traditional oven cure at 340° C. for approximately 5 hours. FIG. 3A shows a substrate 70 that can include a semiconductor die similar to semiconductor die 22, shown previously in FIGS. 2A and 2B. Similarly, substrate 70 can include a composite substrate or wafer including a number of features or elements such as semiconductor die, interconnect structures, RDLs, and encapsulant. A polymer or insulating layer 72, which can be similar to any of polymer layers 30, 42, 50, 59, or 63 is formed over substrate 70. A via or opening 74 can be formed in polymer layer 72 using laser drilling, mechanical drilling, DRIE, or other suitable process. In an embodiment, polymer layer 72 can be a photoimagable PBO layer that is formed and patterned (by coating, exposing, and developing as described above) to create via 74. Via 74 can extend completely through polymer layer 72 to expose a portion of substrate 70. The exposed portion of substrate 70 can include a contact pad, RDL, interconnect structure, or other conductive feature for transmitting electrical signals between points on substrate 70 and points external to the substrate. Via 74 includes via sidewall 76 that is sloped and substantially vertical after the formation of the via. In an embodiment, sidewall 76 of via 74 is formed with an angle relative to substrate 70 that is greater than or equal to 50 degrees.

Substrate 70 and PBO layer 72 can be cured at an elevated temperature using a conventional box oven or vertical furnace so that the profile of sidewall 76 of via 74 are set or fixed with a profile or vertical slope that is similar, or substantially identical, to the profile or vertical slope of sidewall 76 before curing. A similarity in the profile or vertical slope of sidewall 76 before and after curing allows for package design and layout constraints based on similar via shapes and sizes. However, the long cure cycle time of approximately 4-5 hours for box oven or vertical furnace curing adds significantly to the overall process cycle time for the packaging of semiconductor devices such as WLCSPs. The delay can be increased for multiple cures performed for multiple layers. The long cure cycle time results in an economic disadvantage of more parts required for work in progress (WIP) in order to deliver the same number of parts at a given rate. Thus, curing using conventional box ovens and vertical furnaces results in higher inventory numbers, additional costs, and more parts at risk of misprocessing during a given cure cycle.

After formation, via 74 can be subsequently filled with Al, Cu, Sn, Ni, Au, Ag, titanium (Ti), tungsten (W), poly-silicon, or other suitable electrically conductive material using PVD, CVD, electrolytic plating, electroless plating process, or other suitable metal deposition process for subsequent electrical interconnection.

FIG. 3B shows a representative profile, contour, or vertical via slope for a via formed in a polymer layer such as PBO, polyimide, BCB, siloxane-based polymer, epoxy-based polymer, or other suitable material that is cured in a one-step process using thermal curing. For example, thermal curing can be accomplished using a hotplate for a rapid 15 minute cure. The cure is accomplished without an additional step of crosslinking a surface of the polymer, by using, e.g., a UV bake. FIG. 3B shows a substrate 80 and a polymer or insulating layer 82 similar to substrate 70 and PBO layer 72, respectively, from FIG. 3A. A via or opening 84, similar to via 74 from FIG. 3A, can be formed in PBO layer 82 using laser drilling, mechanical drilling, DRIE, or other suitable process. In an embodiment, polymer layer 82 is a photoimagable layer that is formed and patterned (by coating, exposing, and developing as described above) to create via 84. Via 84 can extend completely through insulating layer 82 to expose a portion of substrate 80. The exposed portion of substrate 80 can include a contact pad, RDL, interconnect structure, or other conductive feature for transmitting electrical signals between points on substrate 80 and points external to the substrate. Via 84 includes via sidewall 86 comprising a profile, slope, or taper that can be substantially vertical after its initial formation and before undergoing thermal curing.

Substrate 80 and polymer layer 82 are rapidly heated using a thermal process comprising conduction, convection, infrared, microwave heating, or other suitable process, and can also be heated on a hot plate. Polymer layer 82 can be thermally cured by increasing a temperature of the polymer layer at a rate greater than or equal to about 10 degrees Celsius per minute. Polymer layer 82 can also be thermally cured by heating the polymer layer to a temperature greater than or equal to 200 degrees Celsius and then maintaining the temperature of greater than or equal to 200 degrees Celsius for a period of time less than or equal to about 30 minutes such that complete thermal curing the polymer layer, comprising a temperature ramp up, a peak temperature dwell, a temperature ramp down, and a complete thermal anneal, are accomplished in a time of less than or equal to about 60 minutes. In an embodiment, substrate 80 and polymer layer 82 can be almost instantaneously heated within a period of about 1-60 seconds, for example on a hot plate, from a temperature of about 20-25° C. to a temperature of about 350° C. for a standard PBO layer or about 220° C. for low temperature PBO layer. Polymer or PBO layer 82 can then remain at a temperature of about 220° C. or 350° C., respectively, for a time of less than 30 minutes, for a time of approximately 15 minutes, or for a time of less than 15 minutes to thermally cure the polymer layer.

As a result of the rapid heating of polymer layer 82, a profile, slope, or taper of sidewall 86 of via 84 after thermal curing is not constant, set, or fixed with respect to a profile, slope, or taper of sidewall 86 before curing. Instead, the rapid heating of polymer layer 82 causes the polymer layer to soften and for sidewall 86 to relax and flow to form a smaller relative angle, or average relative angle, between substrate 80 and a top or upper surface of polymer layer 82 opposite substrate 80, as shown in FIG. 3B. According to a possible theory, the relaxation and flow of sidewall 86 is due to the rapidly increasing or ramping temperature exceeding a glass transition temperature ($T_g$) of polymer layer 82, which advances during the thermal cure. If the increasing or ramping temperature of polymer layer 82 exceeds the $T_g$ of the polymer layer before the polymer layer has had an opportunity to thermally cross-link, the polymer layer will tend to soften and flow, thereby creating a shallower via profile or a profile with a smaller average relative angle between a surface of substrate 80 and a surface of polymer layer 82 opposite the surface of the substrate.

A dissimilarity in the profile or vertical slope of sidewall 86 before and after curing requires package design and layout constraints to account for via sizes before and after curing, which typically increases via pitch. A dissimilarity in the profile or vertical slope of sidewall 86 before and after curing is also reflected in the differences in slope between FIGS. 3A and 3B since the slope shown in FIG. 3A approximates the slope of via 84 before undergoing rapid thermal curing, as described above. After formation, via 84 can be subsequently filled with Al, Cu, Sn, Ni, Au, Ag, Ti, W, poly-silicon, or other suitable electrically conductive material using PVD, CVD, electrolytic plating, electroless plating process, or other suitable metal deposition process for subsequent electrical interconnection.

FIG. 3C shows a representative profile, contour, or vertical via slope for a via formed in a polymer layer such as PBO, polyimide, BCB, siloxane-based polymer, epoxy-based polymer, or other suitable material that is cured in a two-step process comprising crosslinking a surface of the polymer in a first process and thermally curing the polymer layer in a second process. For example, thermal curing can be accomplished using a hotplate for a rapid 15 minute cure after crosslinking a surface of the polymer, by using, e.g., a UV bake. FIG. 3C shows a substrate 90 and a polymer or insulating layer 92 similar to substrate 80 and PBO layer 82, respectively, from FIG. 3B. A via or opening 94 is formed in polymer layer 92 using laser drilling, mechanical drilling, DRIE, or other suitable process. In an embodiment, polymer layer 92 is a photoimagable layer that is formed and patterned (by coating, exposing, and developing as described above) to create via 94. Via 94 can extend completely through polymer layer 92 to expose a portion of substrate 90. The exposed portion of substrate 90 can include a contact pad, RDL, interconnect structure, or other conductive feature for transmitting electrical signals between points on substrate 90 and points external to the substrate. Via 94 includes via sidewall 96 that is sloped and can be substantially vertical after the formation of the via. In an embodiment, sidewall 96 of via 94 is formed with an average angle relative to substrate 90 that is greater than or equal to about 50 degrees.

After formation of via 94 and before curing of polymer layer 92 using a thermal process comprising conduction, convection, infrared, microwave heating, or other suitable process, the polymer layer undergoes a first process to crosslink a surface of the polymer layer, such as a UV bake. In an embodiment, the UV bake can occur at a temperature in a range of about 100-200° C. for 0-3 minutes or 1-2 minutes. Additionally, the UV bake can occur at a temperature of 140-180° C. for a period of about 60-140 seconds. By treating polymer layer 92 with UV exposure at an elevated temperature prior to the cure step, a profile of via 94, including the slope or contour of sidewall 96, is stabilized by cross-linking the surface of polymer layer 92. The temperature of the UV bake should be below the glass transition temperature ($T_g$) of polymer layer 92 to prevent flow of the polymer layer and cause undesired via flow or deformation of the via. On the other hand, the temperature of the UV bake should be high enough to ensure sufficient cross-linking of a surface of polymer layer 92, including a surface or sidewall 96, to stabilize the polymer layer during a subsequent second process such as thermal curing. The stabilized surface of polymer layer 92, including sidewall 96, prevents the polymer layer from softening or flowing such that a profile, contour, or slope of sidewall 96 does not relax and flow to form a smaller average relative angle between substrate 90 and a top or upper surface of polymer layer 92 opposite substrate 90 during the thermal curing process.

After the crosslinking of the surface of polymer layer 92, including via 94, substrate 90 and polymer layer 92 undergo a second process. The second process can comprise rapid thermal curing comprising conduction, convection, infrared, microwave heating, or other suitable process, and can also be heated on a hot plate. Polymer layer 92 can be thermally cured by increasing a temperature of the polymer layer at a rate greater than or equal to about 10 degrees Celsius per minute. Polymer layer 92 can also be thermally cured by heating the polymer layer to a temperature greater than or equal to 200 degrees Celsius and then maintaining the temperature of greater than or equal to 200 degrees Celsius for a period of time less than or equal to about 30 minutes such that complete thermal curing the polymer layer, comprising a temperature ramp up, a peak temperature dwell, a temperature ramp down, and a complete thermal anneal, are accomplished in a time of less than or equal to about 60 minutes. In an embodiment, substrate 90 and polymer layer 92 can be almost instantaneously heated within a period of about 1-60 seconds, for example on a hot plate, from a temperature of about 20-25° C. to a temperature of greater than or equal to about 200° C. Polymer layer 92 can then remain at a temperature of greater than or equal to about 200° C., respectively, for a time of less than 30 minutes, for a time of approximately 15 minutes, or for a time of less than 15 minutes to thermally cure the polymer layer. Optionally, the thermal curing process can be in a low oxygen environment in which $O_2$ comprises less than or equal to 100 parts per million of the low oxygen environment.

In an embodiment, polymer layer 92 is a layer of standard PBO that is almost instantaneously heated from room temperature to a temperature of about 350° C. in a low oxygen environment. A low oxygen environment can include an environment in which the ambient atmosphere includes a concentration of $O_2$ less than 100 parts per million (PPM). In an embodiment, Substrate 90 and polymer layer 92 are heated by a hot plate from a temperature of about 20-25° C. to a temperature of about 350° C. within a period of about 1-60 seconds. Polymer layer 92 then remains at a temperature of 350° C. for a time of less than 30 minutes, for a time of approximately 15 minutes, or for a time of less than 15 minutes to thermally cure the PBO layer and to establish final film properties for the PBO layer. As shown in FIG. 3C, an average slope or angle of sidewall 96 is similar to the average slope or angle of sidewall 76 that results from a conventional 4-5 hour curing process that includes a gradual increase in temperature within a box over or vertical furnace as described above with respect to FIG. 1 and FIG. 3A. Because the UV bake of polymer layer 92 causes cross-linking of the PBO layer, the rapid heating of polymer layer 92 does not cause the PBO layer to soften and for sidewall 96 to relax and flow to form a smaller average relative angle as shown in FIG. 3B with respect to sidewall 86 of via 84.

In another embodiment, polymer layer 92 can be a low cure PBO that is almost instantaneously heated from room temperature to a temperature of about 220° C. in a low oxygen environment. A low oxygen environment can include an environment in which the ambient atmosphere includes a concentration of $O_2$ less than 100 PPM oxygen. In an embodiment, Substrate 90 and polymer layer 92 are heated by a hot plate from a temperature of about 20-25° C. to a temperature of about 220° C. within a period of about 1-60 seconds. Polymer layer 92 then remains at a temperature of 220° C. for a time of less than 30 minutes, for a time of approximately 15 minutes, or for a time of less than 15 minutes to thermally cure the PBO layer and to establish final film properties for the PBO layer. As shown in FIG. 3C, an average slope or angle of sidewall 96 is similar to the average slope or angle of sidewall 76 that results from a conventional 4-5 hour curing process that includes a gradual increase in temperature within a box over or vertical furnace as described above with respect to FIG. 1 and FIG. 3A. Because the UV bake of polymer layer 92 causes cross-linking of the PBO layer, the rapid heating of polymer layer 92 does not cause the PBO layer to soften and for sidewall 96 to relax and flow to form a smaller average relative angle as shown in FIG. 3B with respect to sidewall 86 of via 84.

As a result, the profile, contour, or slope of sidewall 96 of via 94, as shown in FIG. 3C, is controlled such that the average slope is similar to the average slope of sidewall 76 of via 74, shown in FIG. 3A, which results from a conventional box oven or vertical oven curing process employing a gradual increase or ramp up temperature. The average slope of sidewall 96 of via 94 is also similar before and after curing of polymer layer 92. Therefore, the more rounded and shallower via profile shown in FIG. 3B, which results from a rapid hot plate cure without the UV bake, is avoided. By maintaining a similar profile or average slope for sidewall 96 before and after curing, packaging can be designed by considering a single, or similar, set of layout constraints that account for via size both before and after curing.

The profile, contour, or slope of sidewall 96 of via 94, as shown in FIG. 3C, can further comprise a witness mark 95. Witness mark 95 can be formed as a discontinuity in a slope of via 94 that extends along a portion of sidewall 96 of via 94. Witness mark 95 can extend along an entirety of the sidewall 96 of via 94 to completely encircle at least a portion of the via, and be disposed completely around the via. Witness mark 95 can be formed on a surface or skin of polymer layer 92, and accordingly to one possible theory is formed as a stretch mark, particularly on a surface of PBO, that results from the described two-step process, including crosslinking a surface of the polymer layer, using for example, a UV bake, and thermally curing the polymer layer after the crosslinking or UV bake. Witness mark 95 can be seen in a cross-sectional side view as well as a plan or top view of sidewalls 96 of via 94. Witness mark 95 can serve as an indication in a semiconductor device or product that a two-step polymer curing process, as described herein, has been utilized.

After formation of via 94, including witness mark 95, via 94 can be subsequently filled with Al, Cu, Sn, Ni, Au, Ag, Ti, W, poly-silicon, or other suitable electrically conductive material using PVD, CVD, electrolytic plating, electroless plating process, or other suitable metal deposition process for subsequent electrical interconnection.

Figure 4A:
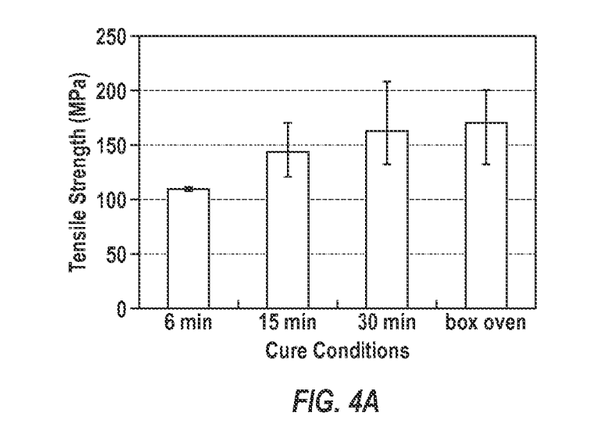
FIGS. 4A-4C illustrate various mechanical properties of standard PBO as a function of PBO curing.
Figure 4B:
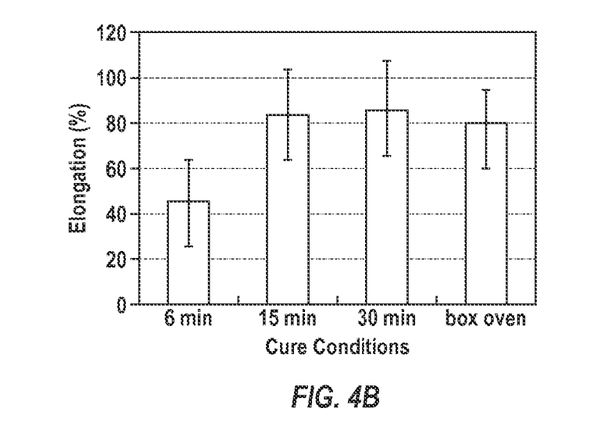
Figure 4C:
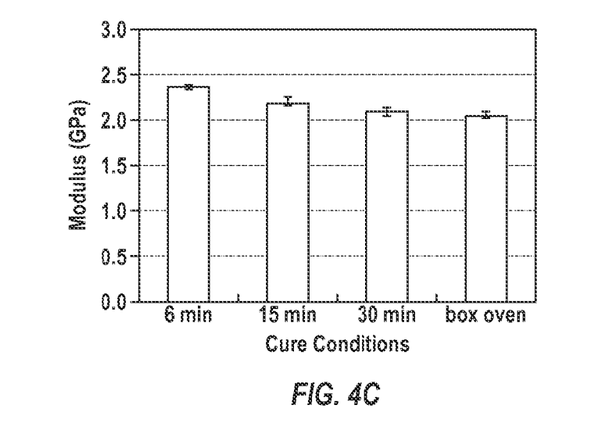

FIGS. 4A-4C illustrate, in graphical form, how mechanical material properties of standard PBO films vary based on cure conditions. FIG. 4A shows results for the tensile strength of materials cured under four different curing conditions: (1) a six minute hot plate cure in a low $O_2$ environment, (2) a 15 minute hot plate cure in a low $O_2$ environment, (3) a 30 minute hot plate cure in a low $O_2$ environment, and (4) a 4-5 hour conventional box oven cure. The tensile strength values for each of the four conditions are an average of the values obtained for five different units.

FIG. 4B shows results, in graphical form, of elongation for materials cured under four different curing conditions: (1) a six minute hot plate cure in a low $O_2$ environment, (2) a 15 minute hot plate cure in a low $O_2$ environment, (3) a 30 minute hot plate cure in a low $O_2$ environment, and (4) a 4-5 hour conventional box oven cure. The elongation percentages for each of the four conditions are an average of the values obtained for five different units.

FIG. 4C shows, in graphical form, results of a modulus of elasticity for materials cured under four different curing conditions: (1) a six minute hot plate cure in a low $O_2$ environment, (2) a 15 minute hot plate cure in a low $O_2$ environment, (3) a 30 minute hot plate cure in a low $O_2$ environment, and (4) a 4-5 hour conventional box oven cure. The modulus of elasticity for each of the four conditions is an average of the values obtained for five different units.

The information shown graphically in FIGS. 4A-4C is also reproduced below in tabular form as part of Table 1. The values presented in Table 1 are an average value for lots of 5 units tested after having been cured under the conditions indicated.

TABLE 1

| Lot No. | Cure Conditions | Tensile Strength (MPa) | Elongation (%) | Modulus (GPa) |
| --- | --- | --- | --- | --- |
| 1 | Hot plate: 350° C., 6 min | 110 | 45 | 2.3 |
| 2 | Hot plate: 350° C., 15 min | 144 | 83 | 2.2 |
| 3 | Hot plate: 350° C., 30 min | 163 | 85 | 2.1 |
| 4 | Box Oven: 340° C., 60 min | 170 | 80 | 2.1 |

Thus, as shown in FIGS. 4A-4C and in Table 1, mechanical properties are within acceptable operating tolerances and are essentially equivalent for a PBO layer cured using a conventional box oven at 340° C. for 60 minutes and for rapid cures of PBO at 350° C. for 15 minutes.

Additional information regarding weight loss temperature is also presented below in Table 2 for lots 1-4 based on the four different curing conditions of: (1) a six minute hot plate cure in a low $O_2$ environment, (2) a 15 minute hot plate cure in a low $O_2$ environment, (3) a 30 minute hot plate cure in a low $O_2$ environment, and (4) a 4-5 hour conventional box oven cure. As shown below in Table 2, weight loss temperature increases with increasing cure time and substantially plateaus for hot plate cures performed at 350° C. for about 15 minutes.

TABLE 2

| | | Weight Loss Temperature (° C.) | |
| --- | --- | --- | --- |
| Lot No. | Cure Conditions | 1% | 5% |
| 1 | Hot plate: 350° C., 6 min | 371 | 471 |
| 2 | Hot plate: 350° C., 15 min | 387 | 480 |
| 3 | Hot plate: 350° C., 30 min | 394 | 486 |
| 4 | Box Oven: 340° C., 60 min | 398 | 486 |

Figure 5A:
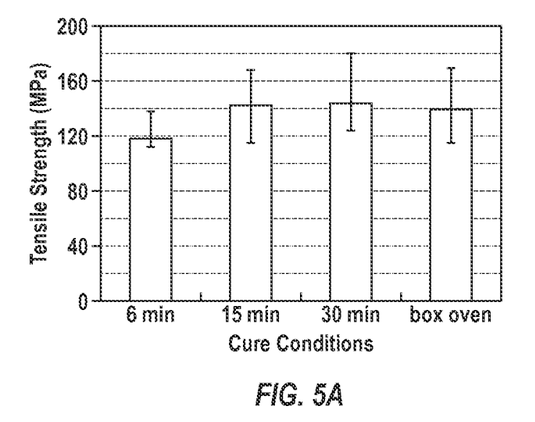
FIGS. 5A-5C illustrate various mechanical properties of low temperature PBO as a function of PBO curing.
Figure 5B:
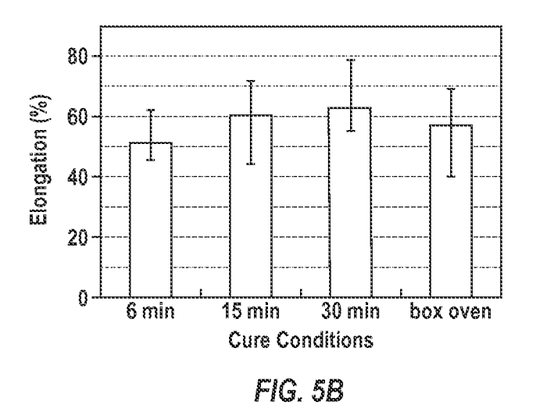
Figure 5C:
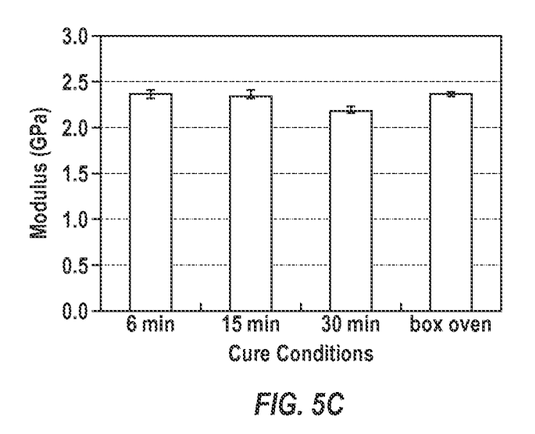

FIGS. 5A-5C illustrate, in graphical form, how mechanical material properties of low temperature PBO films vary based on cure conditions. FIG. 5A shows results for the tensile strength of materials cured under four different curing conditions: (1) a six minute hot plate cure in a low $O_2$ environment, (2) a 15 minute hot plate cure in a low $O_2$ environment, (3) a 30 minute hot plate cure in a low $O_2$ environment, and (4) a 4-5 hour conventional box oven cure. The tensile strength values for each of the four conditions are an average of the values obtained for five different units.

FIG. 5B shows results, in graphical form, of elongation for materials cured under four different curing conditions: (1) a six minute hot plate cure in a low $O_2$ environment, (2) a 15 minute hot plate cure in a low $O_2$ environment, (3) a 30 minute hot plate cure in a low $O_2$ environment, and (4) a 4-5 hour conventional box oven cure. The elongation percentages for each of the four conditions are an average of the values obtained for five different units.

FIG. 5C shows, in graphical form, results of a modulus of elasticity for materials cured under four different curing conditions: (1) a six minute hot plate cure in a low $O_2$ environment, (2) a 15 minute hot plate cure in a low $O_2$ environment, (3) a 30 minute hot plate cure in a low $O_2$ environment, and (4) a 4-5 hour conventional box oven cure. The modulus of elasticity for each of the four conditions is an average of the values obtained for five different units.

The information shown graphically in FIGS. 5A-5C is also reproduced below in tabular form as part of Table 3. The values presented in Table 3 are an average value for lots of 5 units tested after having been cured under the conditions indicated.

TABLE 3

| Lot No. | Cure Conditions | Tensile Strength (MPa) | Elongation (%) | Modulus (GPa) |
|---|---|---|---|---|
| 1 | Hot plate: 220° C., 6 min | 118 | 51 | 2.4 |
| 2 | Hot plate: 220° C., 15 min | 143 | 60 | 2.4 |
| 3 | Hot plate: 220° C., 30 min | 144 | 62 | 2.2 |
| 4 | Box Oven: 200° C., 60 min | 140 | 57 | 2.4 |

Thus, as shown in FIGS. 5A-5C and in Table 3, mechanical properties are within acceptable operating tolerances and are essentially equivalent for a PBO layer cured using a conventional box oven at 200° C. for 60 minutes and for rapid cures of PBO at 220° C. for 15 minutes.

Additional information regarding weight loss temperature is also presented below in Table 4 for lots 1-4 based on the four different curing conditions of: (1) a six minute hot plate cure in a low $O_2$ environment, (2) a 15 minute hot plate cure in a low $O_2$ environment, (3) a 30 minute hot plate cure in a low $O_2$ environment, and (4) a 4-5 hour conventional box oven cure. As shown below in Table 4, weight loss temperature increases with increasing cure time but substantially plateaus for hot plate cures at 220° C. in the range of 15 minutes.

TABLE 4

| | | Weight Loss Temperature (° C.) | |
|---|---|---|---|
| Lot No. | Cure Conditions | 1% | 5% |
| 1 | Hot plate: 220° C., 6 min | 247 | 281 |
| 2 | Hot plate: 220° C., 15 min | 253 | 285 |
| 3 | Hot plate: 220° C., 30 min | 257 | 290 |
| 4 | Box Oven: 200° C., 60 min | 253 | 286 |

Figure 6:
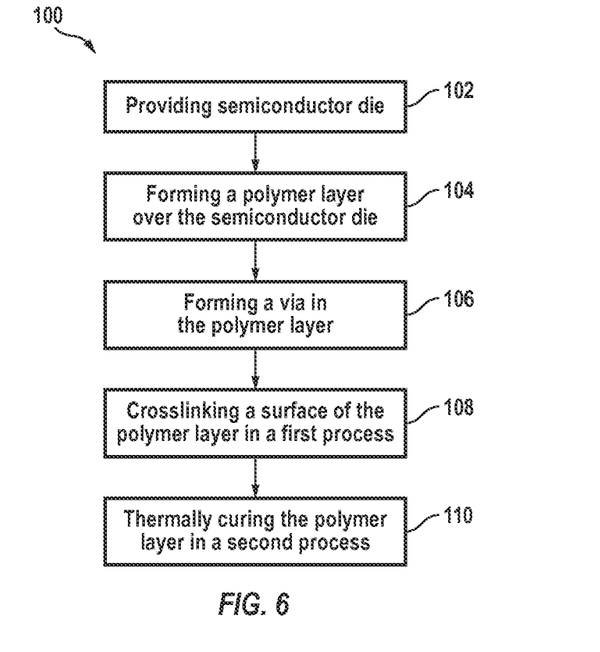
FIG. 6 illustrates steps in a method for curing a PBO layer comprising a via.

FIG. 6 shows a number of steps for a method 100 of efficiently forming a polymer, PBO, or insulating layer comprising vias as part of a semiconductor package. Method 100 comprises a number of steps, including providing semiconductor die, 102. Forming a polymer layer over the semiconductor die; step 104. Forming a via in the polymer layer; step 106. Crosslinking a surface of the polymer layer in a first process; step 108. Thermally curing the polymer layer in a second process; step 110. The curing of the polymer layer can provide for final film properties, in a short period of time, that allow for a steep via wall profile to be maintained during the rapid temperature increase of the cure.

As a result, a polymer layer can be more simply cured to have desirable film properties, and can be cured at a rate more than 10 times faster than with conventional processes using a box oven or a vertical furnace. The reduction in processing time increases throughput for manufacturing by increasing the number of units that can be made for a given period of time. Use of a hot plate for polymer curing also reduces a number of wafers at risk for misprocessing in a given cure cycle. As indicated above, method 100 of curing a polymer layer can be applicable to various polymers and insulating layers, including high temperature dielectric materials for advanced packaging or electronics applications.

In the foregoing specification, various embodiments of the disclosure have been described. It will, however, be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A method of making a semiconductor device, comprising:
providing a semiconductor die;
forming a polymer layer over the semiconductor die;
forming a via in the polymer layer;
crosslinking a surface of the polymer layer in a first process, after forming the via, by exposing the polymer layer to ultraviolet (UV) radiation at an elevated temperature in a range of 100-200 degrees Celsius for a time less than or equal to 3 minutes; and
thermally curing the polymer layer by heating the polymer layer at temperatures greater than or equal to 200 degrees Celsius for a time of less than 15 minutes in a second process that occurs after the first process.

2. The method of claim 1, further comprising forming the polymer layer as a layer of polybenzoxazoles (PBO), polyimide, benzocyclobutene (BCB), siloxane-based polymer, or epoxy-based polymers.

3. The method of claim 1, further comprising exposing the polymer layer to UV radiation to crosslink the surface of the polymer layer in the first process to subsequently control a slope of the via during the second process.

4. The method of claim 1, further comprising thermally curing the polymer layer in the second process by using at least one thermal process selected from the group consisting of conduction, convection, infrared, and microwave heating.

5. The method of claim 1, further comprising thermally curing the polymer layer by increasing a temperature of the polymer layer at a rate greater than or equal to 10 degrees Celsius per minute.

6. The method of claim 1, further comprising completely thermally curing the polymer layer, comprising a temperature ramp up, a peak temperature dwell, a temperature ramp down, and a complete thermal anneal, in a time of less than or equal to 60 minutes.

7. The method of claim 2, further comprising forming the polymer layer as a permanent portion of the semiconductor device.

8. The method of claim 1, further comprising thermally curing the polymer layer in a low $O_2$ environment in which $O_2$ comprises less than or equal to 100 parts per million of the low $O_2$ environment.

9. The method of claim 1, further comprising forming a witness mark as a discontinuity in a slope of the via along a portion of the via.

* * * * *